(12) United States Patent
Nakanishi et al.

(10) Patent No.: US 9,761,326 B2
(45) Date of Patent: Sep. 12, 2017

(54) MEMORY SYSTEM AND MEMORY CONTROL METHOD

(71) Applicant: Toshiba Memory Corporation, Minato-ku (JP)

(72) Inventors: Yu Nakanishi, Yokohama (JP); Daisuke Iwai, Yokohama (JP); Kiwamu Watanabe, Kawasaki (JP); Kenji Funaoka, Kawasaki (JP); Tetsuya Sunata, Kawasaki (JP); Keigo Hara, Ota (JP); Marie Takada, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/065,092

(22) Filed: Mar. 9, 2016

(65) Prior Publication Data

US 2017/0031755 A1 Feb. 2, 2017

Related U.S. Application Data

(60) Provisional application No. 62/198,397, filed on Jul. 29, 2015.

(51) Int. Cl.
*G11C 29/00* (2006.01)
*G11C 29/02* (2006.01)
(Continued)

(52) U.S. Cl.
CPC ........ *G11C 29/028* (2013.01); *G06F 11/1068* (2013.01); *G11C 7/222* (2013.01);
(Continued)

(58) Field of Classification Search
CPC ....... G11C 29/04; G11C 29/028; G11C 29/42; G11C 29/52; G11C 2029/0409; G11C 2029/0411
See application file for complete search history.

(56) References Cited

U.S. PATENT DOCUMENTS 8,402,325 B2 3/2013 Egner
8,862,967 B2 10/2014 Pancholi
(Continued)

FOREIGN PATENT DOCUMENTS

JP 2008-508632 3/2008
JP 2014-35673 2/2014

*Primary Examiner* — Shelly A Chase
(74) *Attorney, Agent, or Firm* — Oblon, McClelland, Maier & Neustadt, L.L.P.

(57) ABSTRACT

According to one embodiment, a memory system includes: a non-volatile memory; a memory interface that reads a received word from the non-volatile memory; a decoder that decodes the received word; a control unit that predicts the number of error bits in the received word read from the non-volatile memory, predicts decoding time on the basis of the number of error bits predicted, and determines an operating clock frequency of the decoder on the basis of the predicted decoding time and requested decoding time being the decoding time requested; and a frequency control unit that supplies the operating clock frequency determined by the control unit to the decoder and supplies voltage corresponding to the operating clock frequency being determined to the decoder.

10 Claims, 10 Drawing Sheets

(51) Int. Cl.
*G06F 11/10* (2006.01)
*G11C 7/22* (2006.01)
*G11C 29/42* (2006.01)
*G11C 29/52* (2006.01)
G11C 29/04 (2006.01)

(52) U.S. Cl.
CPC ............ *G11C 29/023* (2013.01); *G11C 29/42* (2013.01); *G11C 29/52* (2013.01); *G11C 2029/0409* (2013.01); *G11C 2029/0411* (2013.01)

(56) References Cited

U.S. PATENT DOCUMENTS

| | | |
|---|---|---|
| 2014/0047301 A1 | 2/2014 | Kurata |
| 2014/0281678 A1* | 9/2014 | Haga .................. G06F 11/1048 |
| | | 714/6.1 |
| 2016/0225436 A1* | 8/2016 | Wang .................... G11C 11/417 |

* cited by examiner

| NUMBER OF ERROR BITS | OPERATING CLOCK FREQUENCY | PREDICTED DECODING TIME |
|---|---|---|
| 0 OR MORE AND LESS THAN 5 | $F_1$ | $T_{0,1}$ |
| | $F_2$ | $T_{0,2}$ |
| | $F_3$ | $T_{0,3}$ |
| 5 OR MORE AND LESS THAN 10 | $F_1$ | $T_{1,1}$ |
| | $F_2$ | $T_{1,2}$ |
| | $F_3$ | $T_{1,3}$ |
| ⋮ | ⋮ | ⋮ |

FIG.11

| QUALITY OF MEMORY AREA | PREDICTED PROGRAMING TIME |
|---|---|
| SUPERIOR | $P_1$ |
| MODERATE | $P_2$ |
| INFERIOR | $P_3$ |

FIG.12

| OPERATING CLOCK FREQUENCY | ENCODING TIME |
|---|---|
| $F_1$ | $TE_1$ |
| $F_2$ | $TE_2$ |
| $F_3$ | $TE_3$ |

MEMORY SYSTEM AND MEMORY CONTROL METHOD

CROSS-REFERENCE TO RELATED APPLICATIONS

This application is based upon and claims the benefit of priority from U.S. Provisional Application No. 62/198,397, filed on Jul. 29, 2015; the entire contents of which are incorporated herein by reference.

FIELD

Embodiments described herein relate generally to a memory system and a memory control method.

BACKGROUND

A storage device normally stores data that is error correction coded in order to protect the data. Therefore, the error correction coded data stored in the storage device is decoded when being read.

BRIEF DESCRIPTION OF THE DRAWINGS

FIG. 11 is a diagram illustrating an example of a table that illustrates a relationship between quality of a memory area and predicted programming time;

FIG. 12 is a diagram illustrating an example of a table that illustrates a relationship between the operating clock frequency and the encoding time;

DETAILED DESCRIPTION

In general, according to one embodiment, a memory system includes a non-volatile memory, a memory interface that reads a received word from the non-volatile memory, and a decoder that decodes the received word. The memory system further includes: a control unit that predicts the number of error bits in the received word read from the non-volatile memory, predicts decoding time on the basis of the number of error bits predicted, and determines an operating clock frequency of the decoder on the basis of the predicted decoding time and requested decoding time that is the decoding time being requested; and a frequency control unit that supplies the operating clock frequency determined by the control unit to the decoder and supplies voltage corresponding to the operating clock frequency determined by the control unit to the decoder.

Exemplary embodiments of a memory system and a memory control method will be explained below in detail with reference to the accompanying drawings. The present invention is not limited to the following embodiments.

First Embodiment

Figure 1:
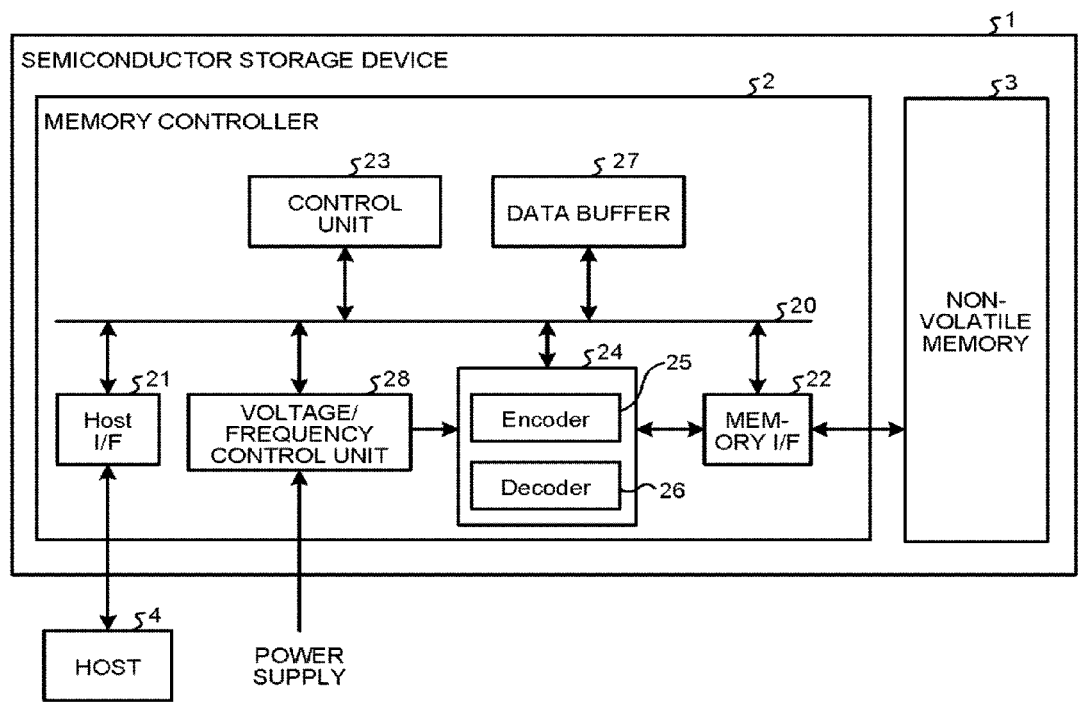
FIG. 1 is a block diagram illustrating an example of a configuration of a memory system according to a first embodiment.

FIG. 1 is a block diagram illustrating an example of a configuration of a memory system (semiconductor storage device) according to a first embodiment. A semiconductor storage device 1 of the present embodiment includes a memory controller 2 and a non-volatile memory 3. The semiconductor storage device 1 can be connected to a host 4 and is connected to the host 4 in the state illustrated in FIG. 1. The host 4 is an electronic device such as personal computer or a mobile terminal.

The non-volatile memory 3 such as a NAND memory stores data in a non-volatile manner. While the NAND memory is used here as the non-volatile memory 3, a memory other than the NAND memory may be used as well. Writing and reading to/from the non-volatile memory 3 are performed by a data unit called a page. The non-volatile memory 3 includes a plurality of word lines and a plurality of bit lines. In the present description, memory cells connected to a single common word line are defined as a memory cell group. The memory cell group corresponds to one page when the memory cell is a single level cell. The memory cell group corresponds to a plurality of pages when the memory cell is a multi-level cell. The memory cell group corresponds to two pages when using a multi-level cell that can store two bits (two bits/cell), for example. The memory cell group corresponds to three pages when using a multi-level cell that can store three bits (three bits/cell).

The memory controller 2 controls write into the non-volatile memory 3 according to a write command from the host 4. The memory controller 2 also controls read from the non-volatile memory 3 according to a read command from the host 4. The memory controller 2 includes a host I/F 21 a memory I/F 22 (memory control unit), a control unit 23, an encoder/decoder 24, a data buffer 27, and a voltage/frequency control unit (frequency control unit) 28, which are connected to one another by an internal bus 20.

The host I/F 21 outputs a command and user data (write data) received from the host 4 to the internal bus 20. Note that in the present embodiment, data received from the host 4 and written into the non-volatile memory 3 is called the user data. The host I/F 21 also transmits user data read from the non-volatile memory 3 and a response from the control unit 23 to the host 4.

The memory I/F 22 controls processing that writes the user data or the like into the non-volatile memory and processing that reads the user data from the non-volatile memory 3 on the basis of an instruction by the control unit 23.

The encoder/decoder 24 includes an encoder 25 and a decoder 26. The encoder 25 encodes the user data and generates a codeword. The codeword is stored in one page or a plurality of pages in the non-volatile memory 3. The decoder 26 decodes a received word corresponding to the codeword and corrects an error in the received word. The received word error-corrected by the decoder 26 is transmitted to the host 4 through the host I/F 21. In the present embodiment, the received word represents read data corresponding to the codeword stored in the non-volatile memory 3. The received word corresponding to the codeword generated by the encoder 25 matches the codeword generated by the encoder 25 when no error is generated while the codeword is generated by the encoder 25, stored in the non-volatile memory 3 and read. The encoder/decoder 24 can employ BCH encoding, RS encoding, or low density parity check (LDPC) encoding as an encoding method. The encoding method is not limited to these methods where any method may be employed. The decoder 26 of the present embodiment is compatible with a plurality of operating clock frequencies. The decoder 26 of the present embodiment is also compatible with a plurality of supply voltages.

The control unit 23 has control over the semiconductor storage device 1. The control unit 23 is a central processing unit (CPU) and a micro processing unit (MPU), for example. A memory may be included in the control unit 23 as well. The control unit 23 performs control according to a command when the command is received from the host 4 via the host I/F 21. The control unit 23 Instructs the encoder 25 to encode the user data to be written when receiving a write request from the host 4, for example. Moreover, the control unit 23 instructs the memory I/F 22 to write the codeword generated by the encoder 25 into the non-volatile memory 3. The control unit 23 uses an address conversion table or the like to manage correspondence between a logical address of the user data received from the host 4 and a destination on the non-volatile memory 3 to which the codeword is written, namely a physical address on the non-volatile memory 3. When receiving a read request from the host 4, the control unit 23 finds the physical address on the non-volatile memory 3 on the basis of a logical address of a read target specified from the host 4 and correspondence between the logical address and the physical address. The control unit 23 then instructs the memory I/F 22 to read data from the non-volatile memory 3 while specifying the physical address being found. Moreover, the control unit 23 instructs the decoder 26 to decode the received word being read from the non-volatile memory 3.

The data buffer 27 temporarily stores the user data received from the host 4 until it is stored in the non-volatile memory 3 and temporarily stores data read from the non-volatile memory 3 until it is transmitted to the host 4. The data buffer 27 is formed of a general-purpose memory such as a static random access memory (SRAM) or a dynamic random access memory (DRAM).

Figure 2:
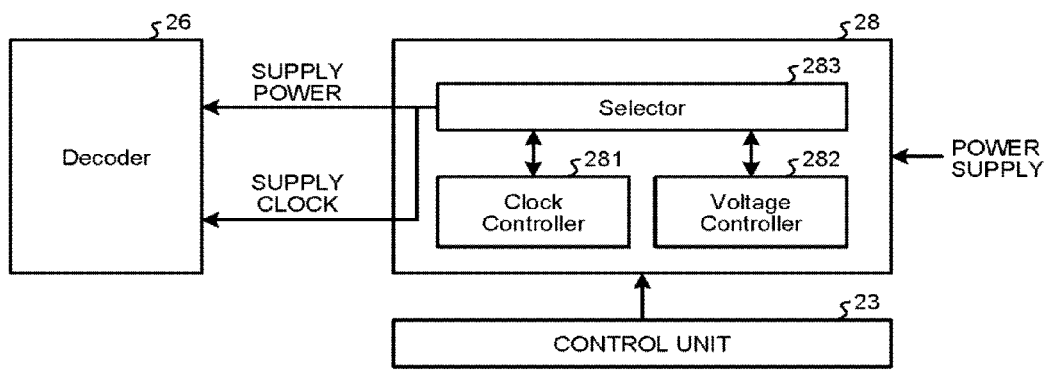
FIG. 2 is a diagram illustrating an example of a configuration of a voltage/frequency control unit according to the first embodiment.

The voltage/frequency control unit 28 controls the operating clock frequency supplied to the decoder 26 as well as a power supply voltage supplied to the decoder 26. FIG. 2 is a diagram illustrating an example of a configuration of the voltage/frequency control unit 28 according to the present embodiment. As illustrated in FIG. 2, the voltage/frequency control unit 28 of the present embodiment includes a clock controller 281, a voltage controller 282, and a selector 283. A clock controller 281 can generate a clock of a plurality of frequencies and supplies a clock having frequency selected by the selector 263 to the decoder 26. A voltage controller 282 converts a voltage value of power supplied from an internal or external power supply of the memory controller 2 into a voltage value selected by the selector 283, and supplies the converted power to the decoder 26. The operation of the voltage/frequency control unit 28 of the present embodiment will be described in detail below.

FIG. 1 illustrates the example of the configuration in which the memory controller 2 includes the encoder/decoder 24 and the memory I/F 22. However, the encoder/decoder 24 may instead be included into the memory I/F 22. Moreover, the voltage/frequency control unit 26 may be included into the control unit 23.

Figure 3:
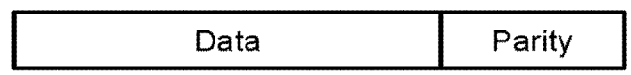
FIG. 3 is a diagram illustrating an example of a configuration of a codeword according to the first embodiment.

In the present embodiment, as described above, the user data written into the non-volatile memory 3 is encoded. FIG. 3 is a diagram illustrating an example of a configuration of a codeword according to the present embodiment. FIG. 3 illustrates the example where the codeword is formed of the user data and parity that is redundant data generated by encoding the user data. While FIG. 3 illustrates the example of using a systematic code in the encoding, a non-systematic code that cannot be separated into the user data and the parity may be used instead of the systematic code in the encoding performed in the present embodiment.

The received word being read from the non-volatile memory 3 possibly includes an error. The error can be corrected by decoding the received word when the number of errors falls within error correction capability of the codeword, namely within the number of errors that can be corrected. In general, the operation time required for decoding (hereinafter referred to as decoding time) increases as the number of errors increases. The decoding time also depends on the operating clock frequency of the decoder 26. The operation time decreases as the operating clock frequency gets higher, but power consumption increases as the operating clock frequency gets higher. This is because the upper limit of the operable clock frequency depends on the operating voltage, namely the power supply voltage being supplied, where the operating voltage needs to be increased as the operating clock frequency is higher.

On the other hand, a requested value is sometimes determined for reading time that is time after a read request is received from the host 4 until data being read is transmitted to the host 4. In the present embodiment, the requested value for the reading time will be hereinafter referred to as requested reading time. The operation time is short when the received word has a small number of errors, in which case actual reading time can be shorter than the requested reading time. In such case, the power consumption can be reduced by lowering the operating clock frequency and voltage of the decoder 26.

Figure 4:
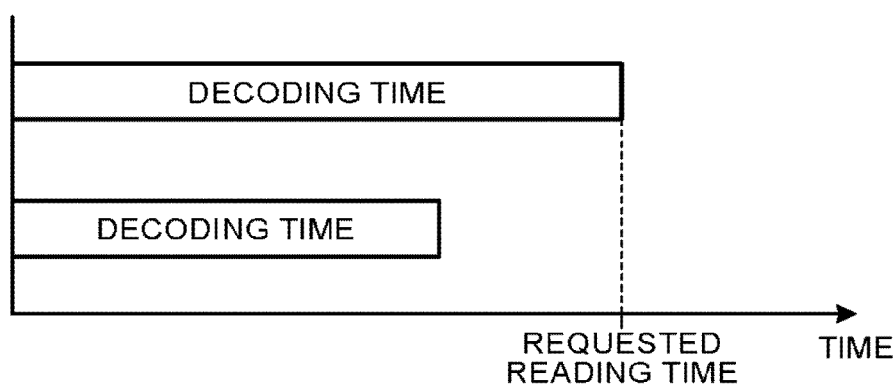
FIG. 4 is a diagram illustrating an example of requested reading time and decoding time.

FIG. 4 is a diagram illustrating an example of the requested reading time and the decoding time. The upper bar in FIG. 4 represents the decoding time when the operating clock frequency equals 133 MHz and the number of error bits (the number of error bits per received word) equals five bits, while the lower bar in FIG. 4 represents the decoding time when the operating clock frequency equals 200 MHz and the number of error bits equals five bits. When the numbers of error bits are the same as in this example, the higher operating clock frequency results in the shorter decoding time. Where the number of error bits equals five bits as illustrated in FIG. 4, the decoding time falls within the requested reading time even when the operating clock frequency equals 133 MHz. Accordingly, in the example illustrated in FIG. 4, the decoder need only be operated with the operating clock frequency of 133 MHz, whereby the power consumption can be reduced compared to when the operating clock frequency equals 200 MHz. On the other hand, as described above, the decoding time increases as the number of error bits increases so that, when the number of error bits is larger than five bits, the decoding time may not fall within the requested reading time with the operating clock frequency of 133 MHz. Note that the actual reading time includes not only the decoding time but also time it takes to perform read from the non-volatile memory 3, but the time it takes to perform read from the non-volatile memory 3 is shorter than the decoding time and is thus omitted from FIG. 4.

Therefore, in the present embodiment, the operating clock frequency and voltage of the decoder 26 are determined on the basis of the requested reading time and an estimated value of error included in the received word. The reading time can thus meet its request while at the same time the power consumption can be reduced.

Next, there will be described a method of determining the operating clock frequency and voltage of the decoder 26 according to the present embodiment. In the present embodiment, there will be described an example where the requested reading time is determined. The requested reading time may be determined by a notification from the host 4 or determined within the memory controller 2 without depending on the notification from the host 4.

The requested reading time determined by the notification from the host 4 may be reading time that is determined by the memory controller 2 on the basis of a bit rate notified from the host 4, for example. The host 4 notifies the memory controller 2 of the bit rate when the host 4 executes video/audio streaming, for example. The control unit 23 of the memory controller 2 then receives the bit rate via the host I/F 21 and determines the reading time per received word corresponding to the bit rate.

Moreover, the requested reading time determined within the memory controller 2 may be requested reading time that is set when data is read from the non-volatile memory 3 in background processing such as garbage collection (GC) that is executed in idle time during which a command from the host 4 is not executed. A requested value for the reading time can be set at will in the background processing executed in the idle time or the like. The decoder 26 is desirably operated with a low operating clock frequency in order to reduce the power consumption. However, when the reading time is long, the command from the host 4 is possibly received before completing the read. The memory controller 2 can thus set the requested reading time for the background processing while considering these elements. The requested reading time for the background processing may be set in advance and set within the memory controller 2, or may be determined by the memory controller 2 on the basis of the frequency of receiving the command from the host 4.

Another example of the requested reading time determined within the memory controller 2 is reading time that is the longest among reading times of read data to be synchronized, when the read data having dependency is synchronized. This example will be described in a third embodiment.

Figures 5, 6:
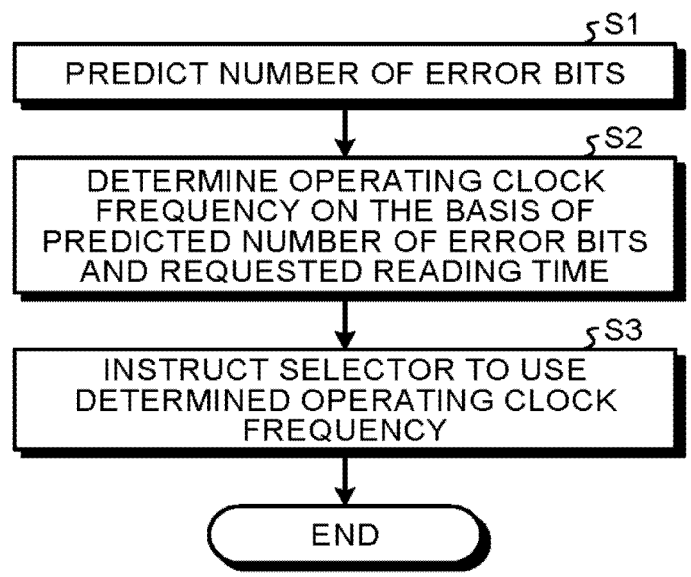
FIG. 5 is a diagram illustrating an example of a configuration of a table that illustrates predicted decoding time for each number of error bits and each operating clock frequency.
FIG. 6 is a flowchart illustrating an example of a procedure performed by a control unit to select the operating clock frequency.

The control unit 23 of the memory controller according to the present embodiment holds the requested reading time determined by the notification from the host 4 or the requested reading time determined by the control unit 23. Moreover, the control unit 23 holds predicted decoding time for each number of error bits and each operating clock frequency in advance. The control unit 23 for example holds the predicted decoding time for each number of error bits and each operating clock frequency in a table form as illustrated in FIG. 5. FIG. 5 is a diagram illustrating an example of a configuration of a table that illustrates the predicted decoding time for each number of error bits and each operating clock frequency. As illustrated in FIG. 5, the table stores the predicted decoding time for each number of error bits and each operating clock frequency. Note that while the control unit 23 in this example holds the predicted decoding time for each number of error bits and each operating clock frequency in the table, the control unit may instead hold a calculation formula to calculate the predicted decoding time, and calculate the predicted decoding time according to the calculation formula while using the number of error bits and the operating clock frequency as input. The predicted decoding time for each number of error bits and each operating clock frequency may be calculated in advance by simulation using a design value or the like, or calculated in advance by an actual measurement.

In the example illustrated in FIG. 5, the number of error bits is classified into stages every five bits such as a stage with the number of error bits being zero bit or more and less than five bits and a stage with the number of error bits being five bits more and less than 10 bits. Then, the table stores the predicted decoding time for each of three operating clock frequencies $F_1$, $F_2$, and $F_3$ at each stage of the number of error bits. In the example illustrated in FIG. 5, the stage of the number of error bits is determined such that a zero stage corresponds to the number of error bits being zero bit or more and less than five bits and a first stage corresponds to the number of error bits being five bits or more and less than 10 bits. In FIG. 5, $T_{i,j}$ represents the decoding time when the decoder 26 is operated with an operating clock frequency $F_j$ and the number of error bits included in the received word corresponds to an i stage. Note that when the number of error bits is classified into stages every five bits as illustrated in FIG. 5, an average or the maximum value of predicted values of the decoding time with the number of error bits corresponding to the stages may be used as the value of $T_{i,j}$, for example.

While the number of error bits is classified into stages every five bits in this example, the number of error bits may be classified in another way as well. The number of error bits may be classified into stages every bit, or classified into stages having unequal number of bits such as a stage with the number of error bits being zero bit or more and less than five bits, a stage with the number of error bits being five bits or more and less than seven bits, and a stage with the number of error bits being seven bits or more and less than eight bits, for example. Moreover, while the decoder 26 is compatible with the three operating clock frequencies in the example illustrated in FIG. 5, the decoder 26 may be compatible with a different number operating clock frequencies as well.

FIG. 6 is a flowchart illustrating an example of a procedure performed by the control unit 23 to select the operating clock frequency. First, the control unit 23 finds a physical address on the non-volatile memory 3 that stores the codeword corresponding to the read user data for which a read request is made from the host 4 or the user data which needs to be read in order to perform internal processing, and predicts the number of error bits in the received word corresponding to the codeword read from the non-volatile memory 3 on the basis of the physical address (step S1).

Any method such as the following methods can be employed as a method of predicting the number of error bits in the received word.

(A) From a memory area on the non-volatile memory 3 corresponding to the physical address of a read target, use the number of error bits acquired at the time of decoding the received word read in the past as a predicted value.

(B) Actually read the received word corresponding to the read target, input it to the decoder 26, and use the number of error bits acquired in preprocessing of the decoding performed by the decoder 26 as a predicted value.

(C) Write the codeword into the non-volatile memory 3 while adding known data thereto, and predict the number of error bits in the received word on the basis of the number of error bits within the read data corresponding to the known data when reading.

In method (A), the decoder 26 notifies the control unit 23 of the number of error bits acquired by decoding. The control unit 23 receives the number of error bits for each received word from the decoder 26, and stores the number of error bits as internal or external memory error information in association with the physical address of the received word. Then, in step S1 above, the control unit refers to the stored error information and finds the number of error bits in the physical address corresponding to the codeword corresponding to the user data to be read. While the error information is stored in association with the physical address in this case, information with which the memory area on the non-volatile memory 3 can be identified may be used instead of using the physical address.

Method (B) will now be described. The decoder 26 can sometimes find the number of errors in the preprocessing of the decoding or as a part of the decoding. The number of errors can be found from an outcome of syndrome calculation, for example. In this case, the decoder 26 notifies the control unit 23 of the number of errors calculated for the received word corresponding to the read target, whereby the control unit 23 uses the number of errors as the predicted value in step S1. The number of error bits is calculated on the basis of the actual received word in method (B) so that the predicted value has the highest reliability.

Method (C) will now be described. In writing the codeword into the non-volatile memory 3, the memory controller 2 adds the known data (such as a predetermined number "1") to the codeword and writes the added known data together with the codeword into the non-volatile memory 3. The known data is written on the same page as the codeword when the codeword is stored on a single page, for example. At the time of reading, the known data is read while associated with the codeword. The memory controller 2 compares the known data being read with correct known data and counts the number of bits with a different comparison result. The memory controller 2 then predicts the number of error bits in the received word on the basis of the counted number of bits and a ratio of the number of bits in the received word to the number of bits in the known data. Specifically, where $n_e$ is the counted number of bits, $n_r$ is the number of bits in the received word, and $n_c$ is the number of bits in the known data, for example, the predicted value is calculated as $n_e \times n_r / n_c$. The aforementioned processing may be performed by the control unit 23, or a processor performing the aforementioned processing may be provided separately from the control unit 23.

Moreover, there may be employed a method of predicting the number of error bits by using at least one of a write count and an erase count of the non-volatile memory 3. The control unit 23 stores, in an internal or external memory, the write count for each block being an erase unit of the non-volatile memory 3, for example. Then, in step S1, the control unit 23 finds the write count of the block corresponding to the physical address of the read target on the basis of the write count being stored, and predicts the number of error bits on the basis of the write count being found. In general, the error increases as the write count increases. Accordingly, for example, the control unit 23 determines the predicted value of the number of error bits such that the predicted value increases as the write count increases by determining the value of a predicted number of error bits to be proportional to the write count. The number of error bits is predicted by using the erase count in the same manner as when using the write count.

Moreover, a soft decision value may be used as input depending on a decoding algorithm executed by the decoder 26. In this case, there may be employed a method of predicting the number of error bits by using data read from the non-volatile memory 3 as the soft decision value. When the non-volatile memory 3 is a NAND memory, the data read as the soft decision value from the non-volatile memory 3 is obtained upon converting the data read from the non-volatile memory 3 by soft bit read into likelihood information.

Figure 7:
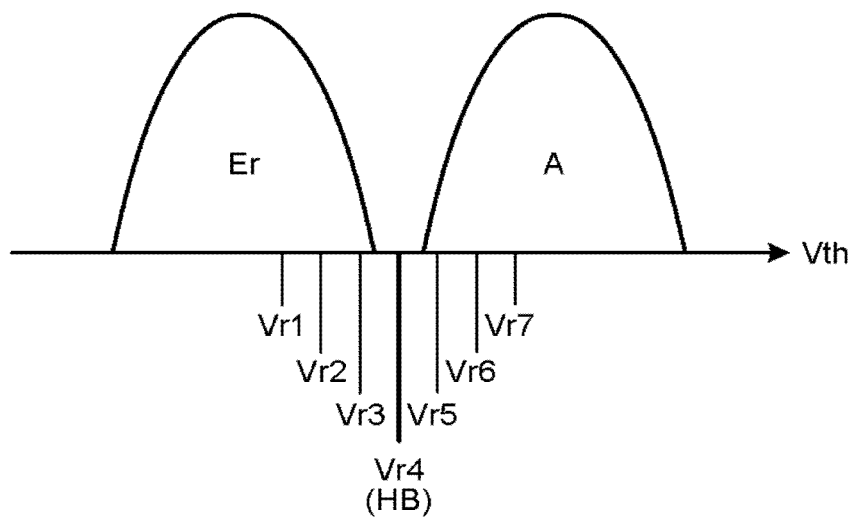
FIG. 7 is a diagram illustrating soft bit read.

FIG. 7 is a diagram illustrating the soft bit read. In FIG. 7, a horizontal axis represents a threshold voltage while a vertical axis represents frequency. When the non-volatile memory 3 is the NAND memory, an electron is injected at the time of writing data such that an electron count (electric charge) at a floating gate corresponds to any of a plurality of distribution (threshold distributions) according to a data value. In order to simplify the description, there will be described an example of storing one bit per cell where one memory cell stores one bit. In storing one bit per cell, one of two distributions corresponds to "0" while the other corresponds to "1". When a voltage is applied to the memory cell, a current flows with the application of a voltage that is higher than or equal to a voltage value corresponding to the electric charge of the memory cell, whereas a current does not flow with the application of a voltage that is lower than the voltage value. Accordingly, this threshold voltage is determined for each memory cell according to the electric charge of the memory cell. This voltage determined according to the electric charge of the memory cell is called a threshold voltage (Vth) in this case. The electric charge is injected to correspond to one of the two threshold distributions in an initial state and, at the time of reading, a reference read voltage separating the two threshold distributions is applied to the memory cell to be able to determine whether or not the data stored in the memory cell corresponds to "1".

FIG. 7 illustrates the example where an Er (Erase) distribution on the left corresponds to the data value "1", while an A distribution on the right corresponds to the data value "0". In addition to the reference read voltage used in hard bit read, the soft bit read executes reading by using a plurality of read voltages on both sides of the read reference voltage. FIG. 7 illustrates the example where the soft bit read is executed by using the total of seven read voltages. A read voltage indicated as Vr4 (HB) is the reference read voltage used in the hard bit read. The soft bit read performs reading by using the total of seven read voltages including Vr4, Vr1, Vr2 and Vr3 that are lower than Vr4, and Vr5, Vr6 and Vr7 that are higher than Vr4. The number of read voltages is not limited to seven in the soft bit read.

Figure 8:
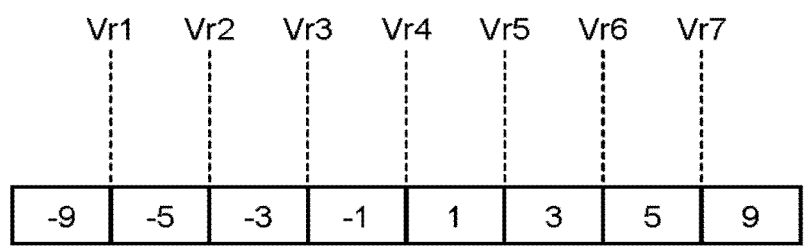
FIG. 8 is a diagram illustrating an example of an LLR table.

Then, for example, a log likelihood ratio (LLR) table can be used to find an LLR that is the likelihood information from a determination result of whether or not the threshold voltage for each memory cell is higher than or equal to each read voltage. FIG. 8 is a diagram illustrating an example of the LLR table. The LLR equals −9 when the threshold voltage of the memory cell is determined to be lower than Vr1, or equals −5 when the threshold voltage of the memory cell is determined to be Vr1 or higher and lower than Vr2, for example. The LLR table is not limited to the example illustrated in FIG. 9. The LLR may also be found by using a calculation formula without using the LLR table.

Either the memory controller 2 or the non-volatile memory 3 may perform the conversion into the LLR by the determination result of whether or not the threshold voltage for each memory cell is higher than or equal to each read voltage. When the conversion is performed by the memory controller 2, the non-volatile memory 3 for example outputs information, for each memory cell, indicating which of eight regions the threshold voltage falls into, the eight regions corresponding to the read voltage lower than Vr1, Vr1 or higher and lower than Vr2, Vr2 or higher and lower than Vr3, Vr3 or higher and lower than Vr4, Vr4 or higher and lower than Vr5, Vr5 or higher and lower than Vr6, Vr6 or higher and lower than Vr7, and Vr7 or higher. The memory controller 2 then finds the LLR on the basis of the LLR table and the information output from the non-volatile memory 3 and stores the LLR into the data buffer 27. The reliability of the LLR being lower as an absolute value thereof is smaller, so that the predicted value of the number of error bits may be determined on the basis of the number of LLRs corresponding to one received word and having the absolute value lower than or equal to the threshold.

While FIGS. 7 and 8 illustrate the example of the single level cell storing one bit per cell, the multi-level cell also executes reading by using a plurality of read voltages at each boundary of the threshold distribution as is the case with the single level cell. The LLR is then calculated on the basis of the result of reading performed by using the plurality of read voltages.

While the methods of predicting the error bit has been illustrated, another prediction method or a combination of two or more of the aforementioned prediction methods may be employed as well. The aforementioned prediction method may also be combined with another prediction method.

Referring back to FIG. 6, after step S1, the control unit 23 determines the operating clock frequency on the basis of the predicted number of error bits and the requested decoding time (step S2). The requested decoding time is a value obtained by subtracting time required to perform read from the non-volatile memory 3 (time required to perform processing other than the decoding operation) from the requested reading time. Accordingly, the time required to perform read from the non-volatile memory 3 is roughly fixed and is short compared to the decoding time. Therefore, for example, the time required to perform read from the non-volatile memory 3 is treated as negligible (that is, the requested reading time=the requested decoding time), or the decoding time is determined in advance as a value that is obtained by subtracting fixed time from the requested reading time, the fixed time being equivalent to the time required to perform read from the non-volatile memory 3. Specifically, in step S2, the control unit 23 uses the table illustrated in FIG. 5 and finds the predicted decoding time that is the longest but shorter than the requested decoding time from among the three predicted decoding times corresponding to the predicted number of error bits (the predicted decoding time corresponding to each of the three operating clock frequencies), and selects the operating clock frequency corresponding to the predicted decoding time being found. Note that while the operating clock frequency corresponding to the predicted decoding time that is the longest but shorter than the requested decoding time is selected in this example, any operating clock frequency may be selected within the range that the predicted decoding time is shorter than the requested decoding time. It is however desirable to have a low operating clock frequency in order to reduce the power consumption since the power consumption can be reduced more effectively as the operating clock frequency is lower.

Next, the control unit 23 instructs the selector 283 the voltage/frequency control unit 28 to use the determined operating clock frequency (step S3). The selector 283 therefore instructs the clock controller 281 to generate an operating clock with the instructed operating clock frequency as well as instructs the voltage controller 282 to output power of the voltage corresponding to the operating clock frequency instructed by the control unit 23. On the basis of the instruction from the selector 283, the clock controller 281 and the voltage controller 282 generate the operating clock and power, respectively, and supply them to the decoder 26 via the selector 283.

The control unit 23 executes the aforementioned processing in each of steps S1 to S3 for each received word. Note that while the operating clock frequency is determined for each received word in this example, the operating clock frequency may also be determined at another timing such as every plurality of received words. When the operating clock frequency is determined every plurality of received words, it may be adapted in step S1 to predict the error bit for each received word, find an average of the results of predicted error bit for the plurality of received words, and use the average as the aforementioned predicted number of error bits, for example.

The aforementioned processing allows the decoder 26 to be operated by using the lowest operating clock frequency among the operating clock frequencies, with which the decoding time falls within the requested decoding time corresponding to the requested reading time, according to the number of error bits or quality of the memory area on the non-volatile memory 3 from which data is read. As a result, the power consumption can be reduced compared to a case where the operating clock frequency is set uniformly to suit the large number of error bits.

Second Embodiment

Figure 9:
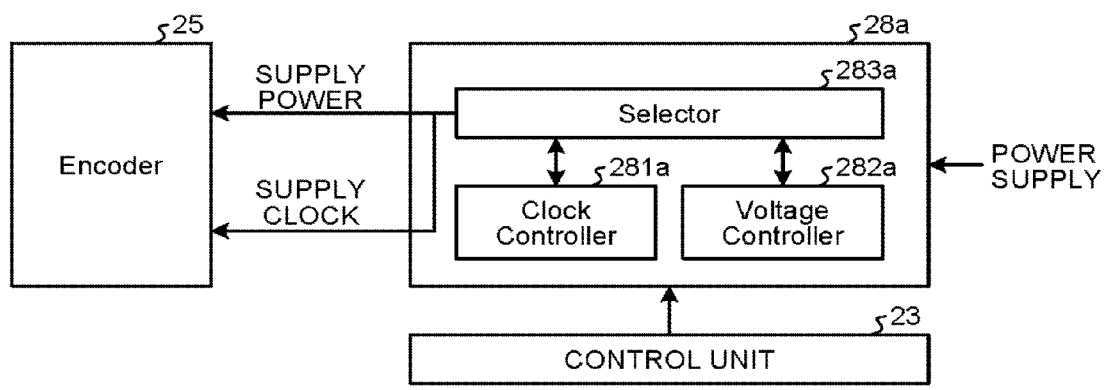
FIG. 9 is a block diagram illustrating an example of a configuration of a voltage/frequency control unit according to a second embodiment.

FIG. 9 is a block diagram illustrating an example of a configuration of a voltage/frequency control unit according to a second embodiment. The configuration of a semiconductor storage device according to the present embodiment is similar to the semiconductor storage device 1 of the first embodiment except that a voltage/frequency control unit 28a is added to the semiconductor storage device 1 of the first embodiment. The voltage/frequency control unit 8a includes a clock controller 281a, a voltage controller 262a, and a selector 283a as illustrated in FIG. 9.

While the operating clock frequency and voltage supplied to the decoder 26 are controlled according to the number of error bits in the example described in the first embodiment, there will be described an example where an operating clock frequency and voltage supplied to an encoder 25 are controlled according to the number of error bits in the present embodiment. Note that while the voltage/frequency control unit 26 that controls operating clock frequency and voltage supplied to a decoder 26 and the voltage/frequency control unit 28 that controls operating clock frequency and voltage supplied to the encoder 25 are both provided in the present example, the voltage/frequency control unit 28a alone may be included to control the operating clock frequency and voltage supplied to the encoder 25 without including the voltage/frequency control unit 28. The voltage/frequency control unit 28 and the voltage/frequency control unit 28a may also be integrated together. The semiconductor storage device 1 described in the first embodiment may be adapted such that the clock controller 281 doubles as the clock controller 1a, the voltage controller 282 doubles as the voltage controller 282a, and the selector 283 doubles as the selector 283a, for example.

A requested writing time is determined in some cases when performing write to a non-volatile memory 3. There is determined a requested writing time that is set when performing write to the non-volatile memory 3 in background processing determined within a memory controller 2, for example.

Data is encoded when performing write to the non-volatile memory 3, where operation time required for encoding depends on the operating clock frequency. Moreover, as with decoding, the operating clock frequency supplied to the encoder 25 depends on power supply voltage supplied to the encoder 25. On the other hand, the operation time required for encoding (encoding time) does not depend on a state of a memory area on the non-volatile memory 3 to which data is written. In contrast, time (programming time) required to perform write or programming to the non-volatile memory 3 depends on a state of the memory area on the non-volatile memory 3 to which data is written. Verify processing or the like that verifies whether data is written correctly is performed in the programming, where write is performed again when the data is not written correctly. Therefore, in general, the programming time is longer when performing write to a memory area prone to errors, namely an inferior memory area, than when performing write to a memory area less prone to errors, namely a superior memory area.

Figure 10:
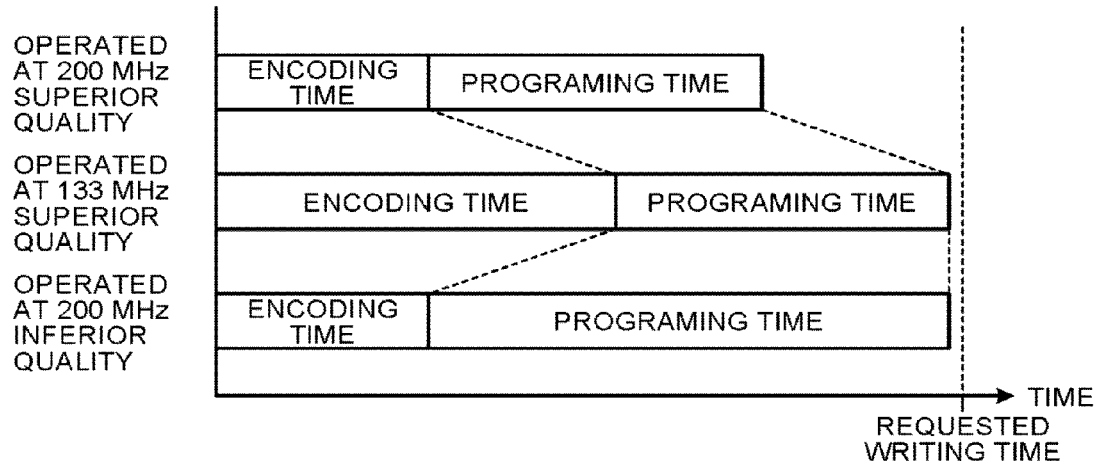
FIG. 10 is a diagram illustrating an example of requested writing time, programming time, and encoding time.

FIG. 10 is a diagram illustrating an example of the requested writing time, programming time, and encoding time. The top bar in FIG. 10 represents predicted programming time and encoding time when the memory area on the non-volatile memory 3 to which data is written is superior, and the encoder 25 is operated with the operating clock frequency of 200 MHz. The second bar in FIG. 10 represents predicted programming time and encoding time when the memory area on the non-volatile memory 3 to which data is written is superior, and the encoder 25 is operated with the operating clock frequency of 133 MHz. The bottom bar in FIG. 10 represents predicted programming time and encoding time when the memory area on the non-volatile memory 3 to which data is written is inferior, and the encoder 25 is operated with the operating clock frequency of 200 MHz.

In the present embodiment, the quality of the memory area on the non-volatile memory 3 to which data is written is predicted to then predict the programming time on the basis of the quality. Accordingly, as illustrated in FIG. 10, the predicted programming time is shorter when the quality of the memory area on the non-volatile memory 3 to which data is written is superior than when the quality is inferior. The programming time and the encoding time are added together to be the writing time, whereby the encoding time can be extended, namely the operating clock frequency of the encoder 25 can be lowered, within the range the encoding time is shorter than or equal to a value obtained by subtracting the predicted programming time from the requested writing time. As a result, the requested writing time can be satisfied while at the same time the power consumption can be reduced compared to when the encoding time is determined uniformly.

The quality of the memory area on the non-volatile memory 3 to which data is written can be predicted in a method similar to the method of predicting the number of error bits in the first embodiment. There may be used a write count and an erase count for each block, or the number of error bits when decoding data read in the past, for example. Note that the programming time varies less by the number of error bits compared to the operation time required for decoding, so that one need only roughly grasp the quality compared to the first embodiment and may predict whether the quality is at any of two levels including superior and inferior or three levels including superior, normal (moderate quality) and inferior without predicting the number of error bits for each received word as with the first embodiment. The quality may also be predicted by a block unit, for example.

A control unit 23 calculates the predicted programming time on the basis of a predicted result of the quality of the memory area as described above. The relationship between the quality of the memory area and the predicted programming time is determined in advance on the basis of a simulation based on a design value or an actual measurement, and the memory controller 2 holds this relationship in a table, for example. FIG. 11 is a diagram illustrating an example of a table that illustrates the relationship between quality of the memory area and the predicted programming time. FIG. 11 illustrates the example where the quality of the memory area is classified into three levels including superior, normal (moderate), and inferior.

Then, the control unit 23 determines the operating clock frequency to be the lowest within the range the encoding time is shorter than or equal to a value (hereinafter referred to as a requested encoding time) obtained by subtracting the predicted programming time from the requested writing time. Note that while the operating clock frequency is determined to be the lowest within the range the encoding time is shorter than or equal to the requested encoding time, any operating clock frequency may be selected as long as the encoding time is shorter than or equal to the requested encoding time. It is however desirable to have a low operating clock frequency in order to reduce the power consumption since the power consumption can be reduced more effectively as the operating clock frequency is lower.

FIG. 12 is a diagram illustrating an example of a table that illustrates a relationship between the operating clock frequency and the encoding time. FIG. 12 illustrates the example where the table stores the encoding time for each of three operating clock frequencies $F_1$, $F_2$, and $F_3$. The encoding time for each operating clock frequency may be calculated in advance by a simulation using a design value or the like, or calculated in advance by an actual measurement. The memory controller 2 holds the table illustrated in FIG. 12, for example, and the control unit 23 calculates the encoding time for each operating clock frequency on the basis of the table and selects the operating clock frequency to be the lowest within the range the encoding time is shorter than or equal to the requested encoding time, as described above.

Figure 13:
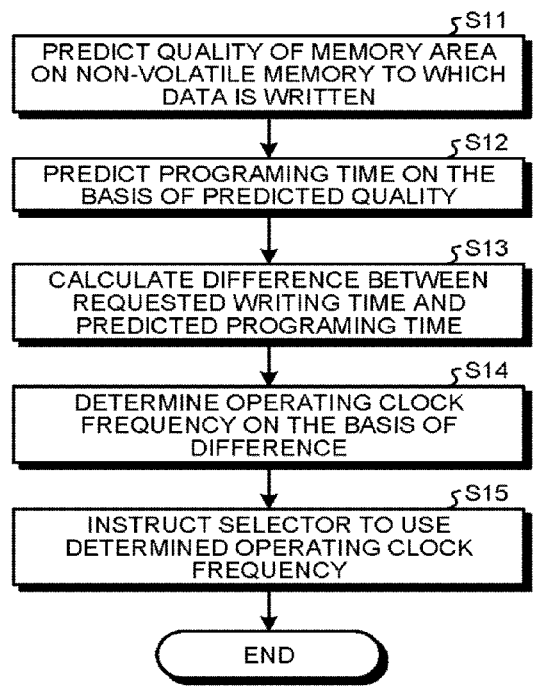
FIG. 13 is a flowchart illustrating an example of a procedure of selecting the operating clock frequency according to the second embodiment.

FIG. 13 is a flowchart illustrating an example of a procedure of selecting the operating clock frequency according to the present embodiment. First, the control unit 23 determines a physical address on the non-volatile memory 3 that stores a codeword corresponding to user data for which a read request is made from a host 4 or user data which needs to be written in order to perform internal processing, and predicts the quality of the memory area on the non-volatile memory 3 to which data is written on the basis of the physical address (step S11).

The control unit 23 predicts the programming time as described above on the basis of the predicted quality (step S12). Next, the control unit 23 calculates a difference between the requested writing time and the predicted programming time (step S13). The control unit 23 determines the operating clock frequency on the basis of the calculated difference, namely the requested encoding time (step S14). Specifically, as described above, the control unit selects the lowest operating clock frequency such that the encoding time is shorter than or equal to the requested encoding time on the basis of the table illustrated in FIG. 12, for example.

The control unit 23 then instructs the selector 283a of the voltage/frequency control unit 28a to use the operating clock frequency being determined (step S15). The selector 263a therefore instructs the clock controller 281a to generate an operating clock with the instructed operating clock frequency as well as instructs the voltage controller 282a to output power with the voltage corresponding to the operating clock frequency instructed by the control unit 23. On the basis of the instruction from the selector 283a, the clock controller 281a and the voltage controller 282a generate the operating clock and power, respectively, and supply them to the encoder 25 via the selector 283a.

The aforementioned processing allows the encoder 25 to be operated by using the lowest operating clock frequency among the operating clock frequencies, with which the encoding time equals the value obtained by subtracting the predicted programming time from the requested writing time, the predicted programming time being calculated according to the quality of the memory area on the non-volatile memory 3 to which data is written. As a result, the power consumption can be reduced compared to the case where the operating clock frequency is set uniformly.

Third Embodiment

Next, there will be described a method of determining an operating clock frequency according to a third embodiment. The configuration of a memory system according to the present embodiment is similar to that of the first embodiment except that voltage/frequency control units 28-1 to 28-3 are included in place of the voltage/frequency control unit 28 and that a decoder 26 and a memory I/F 22 can be operated in parallel. There will be described what is different from the first embodiment while omitting description similar to the first embodiment.

As described in the first embodiment, reading time that is the longest among reading times required between read data to be synchronized can be set as requested reading time, when the read data having dependency is synchronized. The reading time other than the decoding operation time can be fixed as described in the first embodiment, whereby the longest decoding operation time required between the read data to be synchronized car be set as requested decoding time. In the present embodiment, there will be described an example where the read data having dependency is synchronized as described above.

Figure 14:
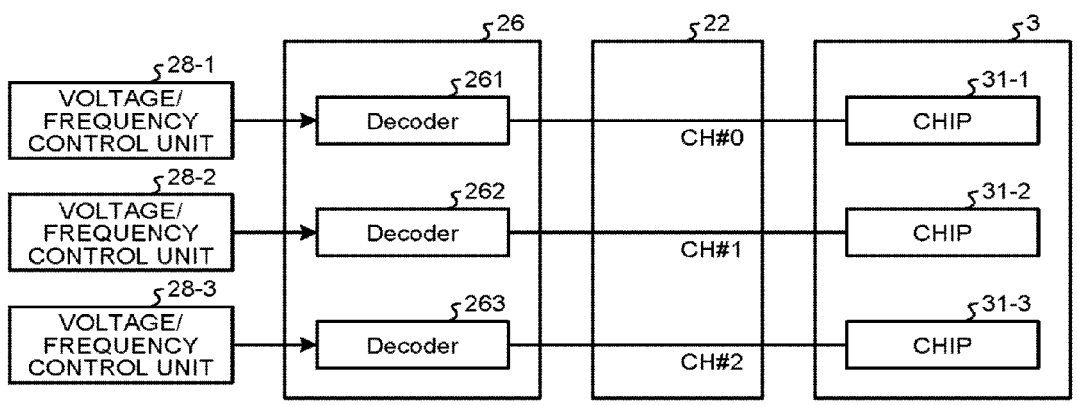
FIG. 14 is a diagram illustrating an example of a configuration of a decoder, a memory I/F, a voltage/frequency control unit, and a non-volatile memory according to a third embodiment.

FIG. 14 is a diagram illustrating an example of a configuration of the decoder 26, the memory I/F 22, the voltage/frequency control units 26-1 to 28-3, and a non-volatile memory 3 when read can be performed in parallel from the non-volatile memory 3. FIG. 14 illustrates the example where three channels including CH#0, CH#1, and CH#2 can be operated in parallel. As illustrated in FIG. 14, the decoder 26 includes a decoder for each channel, namely decoders 261, 262, and 263. This allows data read in parallel from chips 31-1 to 31-3 of the non-volatile memory 3 to be decoded in parallel. Note that while FIG. 14 illustrates the configuration where the three channels can be operated in parallel, the number of channels is not limited to three channels. Each of the voltage/frequency control units 28-1 to 28-3 has the configuration similar to the voltage/frequency control unit 28 of the first embodiment.

When a read request is made from a host 4, data for which the read request is made is stored while distributed in locations within the non-volatile memory 3 from which the data can be read in parallel, for example. When the data for which the read request is made is stored in two locations from which the data can be read in parallel, for example, the data cannot be transmitted to the host 4 until data from both memory areas are decoded. The operation times required for decoding differ when there is a difference in the numbers of error bits in the two memory areas, where the time at which the data read from the memory area with the smaller number of error bits is decoded up to the time at which the data read from the other memory area is decoded corresponds to idle time. In this case, power consumption can be reduced by lowering the operating clock frequency supplied to the decoder 26 that decodes the data read from the memory area with the smaller number of error bits.

Figure 15:
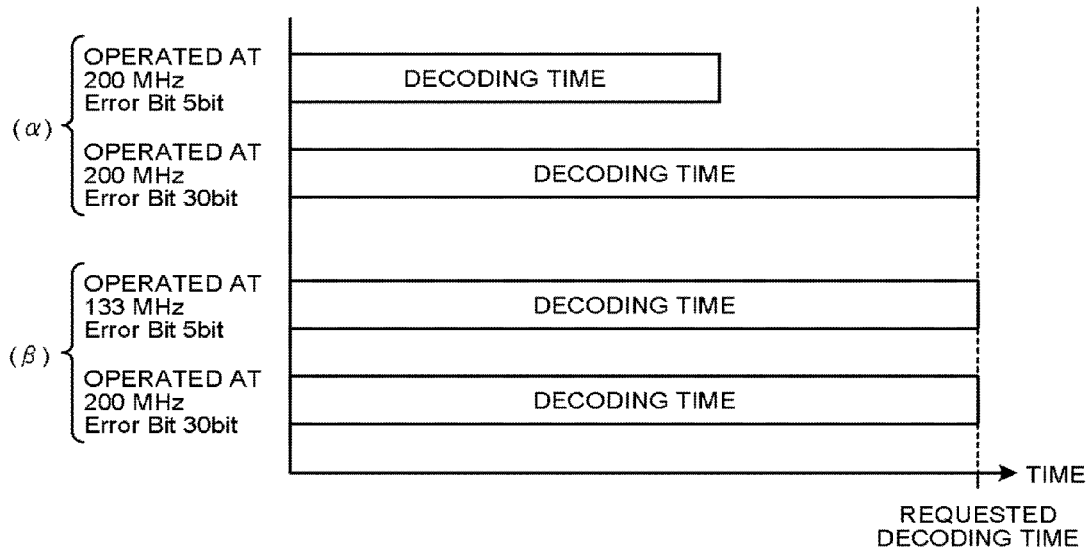
FIG. 15 is a diagram illustrating an example of decoding time when two data having dependency is read.

FIG. 15 is a diagram illustrating an example of decoding time when two data having dependency is read. FIG. 15 illustrates the example where the two decoders 261 and 262 out of the three decoders 261 to 263 illustrated in FIG. 14 are used to perform decoding. That is, the two data having dependency is stored in the chips 31-1 and 31-2 where, for example, the data for which a read request is made from the host 4 is stored in the chips 31-1 and 31-2 in a distributed manner. It is assumed, as illustrated in ($\alpha$) of FIG. 15, that the operating clock frequencies of the decoder 261 and the decoder 262 are the same, but the number of error bits in a received word input to the decoder 261 is different from the number of error bits in a received word input to the decoder 262. FIG. 15 illustrates the example where the number of error bits in the received word input to the decoder 261 equals five bits while the number of error bits in the received word input to the decoder 262 equals 30 bits. In this case, the decoder 261 completes decoding faster than the decoder 262, whereby the idle time is generated. On the other hand, as illustrated in ($\beta$) of FIG. 15, the decoder 261 can complete decoding before the decoder 262 completes decoding even when the operating clock frequency of the decoder 261 is lower than the operating clock frequency of the decoder 262. This shortens the idle time. As a result, when the operating clock frequencies are the same, the power consumption can be reduced by setting the decoding time of the decoder 262, which is expected to complete decoding later, to be the requested decoding time and determining the operating clock frequency of the decoder other than the decoder 262 to be similar to that of the first embodiment. Note that the decoders 261 to 263 hereinafter have the same performance. In other words, operation times of the decoders 261 to 263 vary little when identical data is processed by the decoders.

Figure 16:
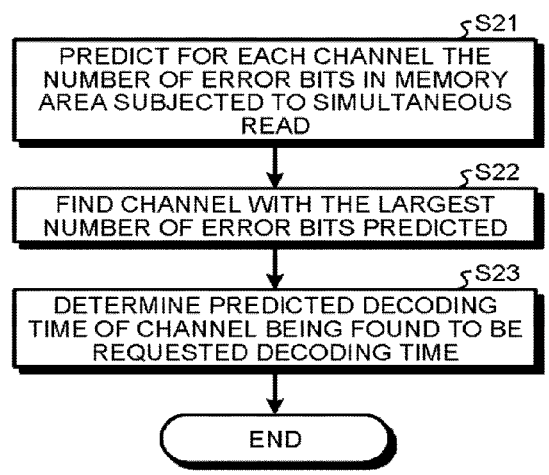
FIG. 16 is a flowchart illustrating an example of a procedure of selecting an operating clock frequency of the decoder according to the third embodiment.

FIG. 16 is a flowchart illustrating an example of a procedure of selecting the operating clock frequency of the decoder according to the present embodiment. First, a control unit 23 predicts for each channel the number of error bits in a memory area subjected to simultaneous reading (step S21). A method of predicting the number of error bits is similar to that of the first embodiment. The memory area subjected to simultaneous reading corresponds to each memory area that stores data having dependency and being read simultaneously. The control unit 23 then finds the channel with the largest number of error bits from among the numbers of error bits predicted (step S22). Next, the control unit 23 determines predicted decoding time for the channel found in step S22 to be the requested decoding time (step S23). Note that the operating clock frequency needs to be determined in step S22 in order to find the predicted decoding time. This operating clock frequency may take any value and is set to the fastest operating clock frequency compatible with the decoders 261 to 263, for example.

After that, the operating clock frequency for each decoder corresponding to the channel other than the channel found in step S22 is determined in a manner similar to the first embodiment while using the decoding time determined in step S23, and a selector corresponding to the channel is instructed to use the determined operating clock frequency.

In the present embodiment, as described above, the decoding time corresponding to the received word with the largest number of error bits is set as the requested decoding time to determine the operating clock frequency and voltage of each decoder, when the data having dependency can be read in parallel. The power consumption can be reduced as a result.

Fourth Embodiment

Next, there will be described a method of determining an operating clock frequency according to a fourth embodiment. The configuration of a memory system according to the present embodiment is similar to that of the second embodiment except that voltage/frequency control units 28a-1 to 28a-3 are included in place of the voltage/frequency control unit 28a and that an encoder 25 and a memory I/F 22 can be operated in parallel. There will be described what is different from the second embodiment while omitting description similar to the second embodiment.

While there has been described the case where the read data having dependency is synchronized in the third embodiment, there will be described an example where write data having dependency is synchronized in the present embodiment. In the present embodiment, requested writing time is determined on the basis of the longest writing time between writing times of the write data to be synchronized. In the present embodiment, there will be described an example where the write data having dependency is synchronized as described above.

Figure 17:
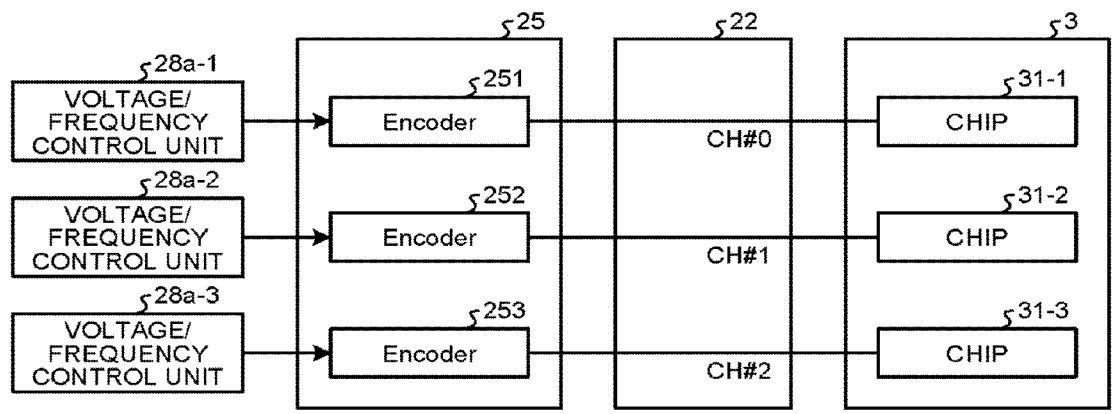
FIG. 17 is a diagram illustrating an example of a configuration of an encoder, a memory I/F, a voltage/frequency control unit, and a non-volatile memory according to a fourth embodiment.

FIG. 17 is a diagram illustrating an example of a configuration of the encoder 25, the memory I/F 22, the voltage/frequency control units 28a-1 to 28a-3, and a non-volatile memory 3 when write can be performed in parallel into the non-volatile memory 3. FIG. 17 illustrates the example where three channels including CH#0, CH#1, and CH#2 can be operated in parallel. As illustrated in FIG. 17, the encoder 25 includes an encoder for each channel, namely encoders 251, 252, and 253. This allows write data to be encoded in parallel into chips 31-1 to 31-3 of the non-volatile memory 3. Note that while FIG. 17 illustrates the configuration where the three channels can be operated in parallel, the number of channels is not limited to three channels. Each of the voltage/frequency control units 29a-1 to 28a-3 has the configuration similar to the voltage/frequency control unit 28a of the second embodiment.

When a write request is made from a host 4, data for which the write request is made is stored while distributed in locations within the non-volatile memory 3 into which the data can be written in parallel, for example. When the data for which the write request is made is stored in two locations into which the data can be written in parallel, for example, the write processing of the data for which the write request is made from the host 4 cannot be completed until data read from both memory areas is written. Programming times vary when there is a difference in the quality of the two memory areas. As a result, when the encoders are operated with the same operating clock frequency, the write processing (including encoding) performed into a superior memory area is completed faster than the write processing performed into an inferior memory area. In this case, power consumption can be reduced by lowering the operating clock frequency supplied to the encoder that encodes the data written into the superior memory area.

Figure 18:
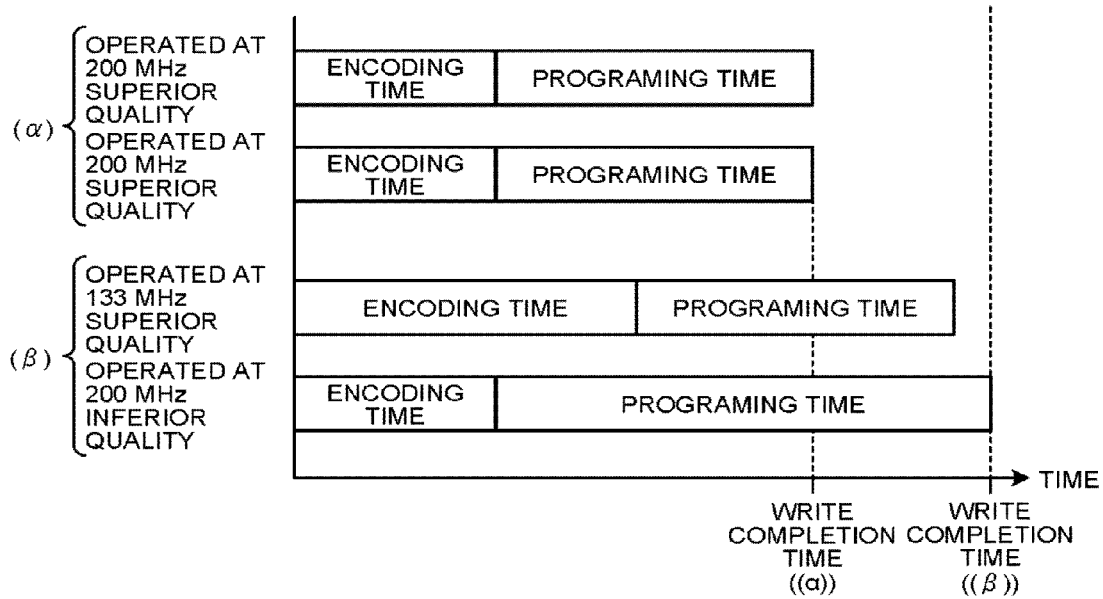
FIG. 18 is a diagram illustrating an example of encoding time when two data having dependency is read.

FIG. 18 is a diagram illustrating an example of encoding time when two data having dependency is read. FIG. 18 illustrates the example where the two encoders 251 and 252 out of the three encoders 251 to 253 illustrated in FIG. 17 are used to perform encoding. That is, the two data having dependency is stored in the chips 31-1 and 31-2 where, for example, the data for which a write request is made from the host 4 is written in the chips 31-1 and 3 in a distributed manner. As illustrated in (α) of FIG. 18, it is assumed that the operating clock frequencies of the encoder 251 and the encoder 252 are the same and that the quality of the memory area into which data encoded by the encoder 251 is written is the same as the quality of the memory area into which data encoded by the encoder 252 is written. In this case, write completion time ((α)) matches between the encoder 251 and the encoder 252.

On the other hand, as illustrated in (β) of FIG. 18, the quality of the memory area into which data encoded by the encoder 251 is written is superior while the quality of the memory area into which data encoded by the encoder 252 is written is inferior. The top bar of (β) in FIG. 16 represents encoding time and programming time of the data encoded by the encoder 251, and the bottom bar represents encoding time and programming time of the data encoded by the encoder 252. In this case, the programming time of the data encoded by the encoder 252 is longer than the programming time of the data encoded by the encoder 251. Therefore, the write processing of the entire data for which the write request is made is not completed until write completion time ((β)). The write completion time of the encoder 251 equals that of the case in (α) when the operating clock frequency supplied to the encoder 252 is kept identical to the operating clock frequency supplied to the encoder 251, whereby the idle time is generated until the write completion time ((β)). On the other hand, as illustrated in (β) of FIG. 18, the write processing of the data encoded by the encoder 251 can be completed before the write processing of the data encoded by the encoder 252 is completed even when the operating clock frequency of the encoder 251 is set lower than the operating clock frequency of the encoder 252. As a result, when the operating clock frequencies are the same, the power consumption can be reduced by setting the requested writing time to be equal to the sum of the programming time and encoding time of the encoder 252, which is expected to complete the write processing later, and determining the operating clock frequency of the encoder other than the encoder 252 to be similar to that of the second embodiment. Note that the encoders 251 to 253 hereinafter have the same performance.

Figure 19:
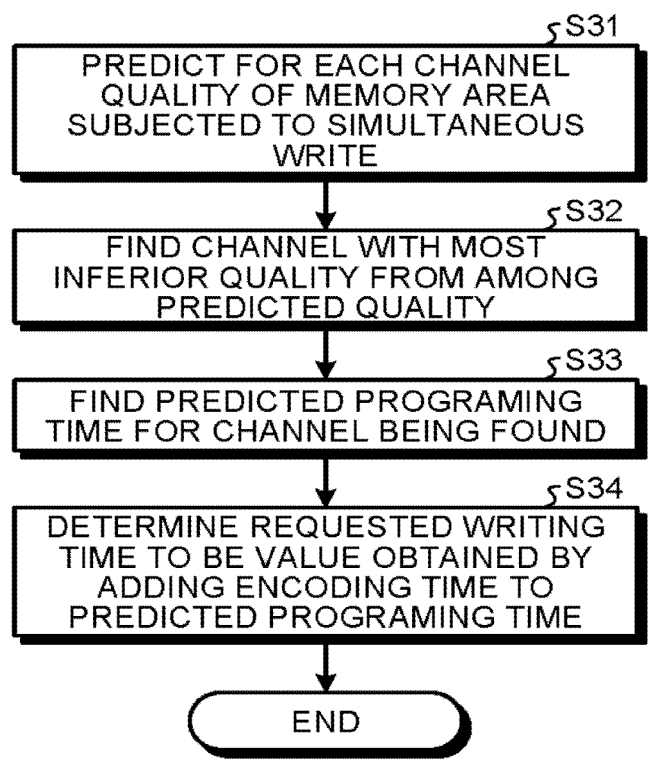
FIG. 19 is a flowchart illustrating an example of a procedure of selecting an operating clock frequency of the encoder according to the fourth embodiment.

FIG. 19 is a flowchart illustrating an example of a procedure of selecting the operating clock frequency of the encoder according to the present embodiment. First, a control unit 23 predicts for each channel the quality of the memory area subjected to simultaneous writing (step S31). A method of predicting the quality is similar to that of the second embodiment. The control unit 23 then finds the channel with the most inferior quality from among the predicted quality (step S32). Next, the control unit 23 determines predicted programming time for the channel found in step S32 (step S33). The control unit 23 determines the requested writing time to be equal to a value obtained by adding the encoding time to the predicted programming time (step S34). Note that the operating clock frequency needs to be determined in step S34 in order to find the encoding time. This operating clock frequency may take any value such as the fastest operating clock frequency compatible with the encoders 251 to 253.

After that, the operating clock frequency for each encoder corresponding to the channel other than the channel found in step S32 is determined in a manner similar to the second embodiment while using the requested writing time determined in step S34, and a selector corresponding to the channel is instructed to use the operating clock frequency.

As described above, the present embodiment is adapted to determine the operating clock frequency and voltage of each encoder by setting the requested writing time to be equal to the value obtained by adding the encoding time to the programming time of the encoder that encodes the data written into the memory area with the most inferior quality, when the data having dependency can be written in parallel. The power consumption can be reduced as a result.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a non-volatile memory;
a memory interface that reads a received word from the non-volatile memory;
at least one decoder that decodes the received word;
a control unit that predicts the number of error bits in the received word read from the non-volatile memory, predicts a decoding time on a basis of the number of error bits predicted, and determines an operating clock frequency of the decoder on a basis of the predicted decoding time and a requested decoding time; and
a frequency control unit that supplies the operating clock frequency determined by the control unit to the decoder and supplies voltage corresponding to the operating clock frequency determined by the control unit to the decoder.

2. The memory system according to claim 1, wherein
the memory interface can read a plurality of received words in parallel through a plurality of channels,
the at least one decoder comprises a plurality of decoders respectively correspond to the plurality of channels, and
the control unit predicts the number of error bits within the received words read in parallel from the non-volatile memory for each channel, sets predicted decoding time of the channel with the largest number of error bits as the requested decoding time and determines an operating clock frequency of the decoder for each channel.

3. The memory system according to claim 1, wherein the control unit predicts the number of error bits within the received word on the basis of the number of error bit acquired in past decoding.

4. The memory system according to claim 1, wherein the control unit predicts the number of error bits within the received word on a basis of the number of error bits acquired in preprocessing of decoding of the received word being read.

5. A memory system comprising:
a non-volatile memory;
at least one encoder that encodes data and generates a codeword;
a memory interface that writes the codeword to the non-volatile memory;
a control unit that predicts quality of a memory area into which the codeword is written, predicts programming time required to perform write into the non-volatile memory on a basis of the predicted quality, and determines an operating clock frequency of the encoder on a basis of the predicted programming time and requested writing time being a requested value of time required to perform encoding and write into the non-volatile memory; and
a frequency control unit that supplies the operating clock frequency determined by the control unit to the encoder and supplies voltage corresponding to the operating clock frequency determined by the control unit to the encoder.

6. The memory system according to claim 5, wherein
the memory interface can read a plurality of received words in parallel through a plurality of channels,
the at least one encoder comprises a plurality of encoders respectively correspond to the plurality of channels, and
the control unit predicts quality within the received words read in parallel from the non-volatile memory for each channel, sets predicted decoding time of the channel with the most inferior quality and determines an operating clock frequency of the encoder for each channel.

7. A memory control method that controls a non-volatile memory, the method comprising:
reading a received word from the non-volatile memory;
decoding the received word by using a at least one decoder;
predicting the number error bits in the received word read from the non-volatile memory, predicting decoding time on a basis of the number of error bits predicted, and determining an operating clock frequency of the decoder on a basis of the predicted decoding time and requested decoding time that is the decoding time requested; and supplying the determined operating clock frequency to the decoder and supplying voltage corresponding to the determined operating clock frequency to the decoder.

8. The memory control method according to claim 7, wherein a plurality of received words can be read in parallel for each channel, the at least one decoder comprises a plurality of decoders respectively correspond to the plurality of channels, and the method comprises:

predicting the number of error bits within the received words read in parallel from the non-volatile memory for each channel, setting predicted decoding time of the channel with the largest number of error bits as the requested decoding time, and determining an operating clock frequency of the decoder for each channel.

9. The memory control method according to claim 7, wherein the number of error bits within the received word is predicted on a basis of the number of error bit acquired in past decoding.

10. The memory control method according to claim 7, wherein the number of error bits within the received word is predicted on a basis of the number of error bits acquired in preprocessing of decoding of the received word being read.

* * * * *